(12) United States Patent
Koide et al.

(10) Patent No.: US 8,811,031 B2
(45) Date of Patent: Aug. 19, 2014

(54) MULTICHIP MODULE AND METHOD FOR MANUFACTURING THE SAME

(75) Inventors: Masateru Koide, Kawasaki (JP); Daisuke Mizutani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 346 days.

(21) Appl. No.: 12/852,696

(22) Filed: Aug. 9, 2010

(65) Prior Publication Data
US 2011/0044015 A1 Feb. 24, 2011

(30) Foreign Application Priority Data
Aug. 20, 2009 (JP) .................... 2009-191283

(51) Int. Cl.
*H05K 1/11* (2006.01)
*H01L 23/14* (2006.01)
*H01L 25/065* (2006.01)
*H01L 23/498* (2006.01)
*H01L 23/373* (2006.01)

(52) U.S. Cl.
CPC ..... *H01L 23/147* (2013.01); *H01L 2224/73253* (2013.01); *H01L 2224/73204* (2013.01); *H01L 2224/16227* (2013.01); *H01L 2924/15311* (2013.01); *H01L 2924/10253* (2013.01); *H01L 25/0655* (2013.01); *H01L 23/49822* (2013.01); *H01L 23/49827* (2013.01); *H01L 23/373* (2013.01); *H01L 2924/15192* (2013.01); *H01L 23/49838* (2013.01); *H01L 2924/09701* (2013.01)
USPC ........... 361/795; 361/719; 361/783; 174/260; 174/261; 438/106; 438/108; 438/118; 438/119; 438/127; 257/692; 257/703

(58) Field of Classification Search
CPC ............. H05K 1/03; H05K 1/05; H05K 1/11; H05K 1/16; H05K 1/18; H05K 3/10; H01L 21/02; H01L 23/48; H01L 23/52; H01L 23/58; H01R 12/04; G02B 6/12
USPC .................. 361/795, 719, 783; 174/260, 261; 438/106, 108, 118, 119, 127; 257/703, 257/692
See application file for complete search history.

(56) References Cited

U.S. PATENT DOCUMENTS 5,300,735 A * 4/1994 Yokono et al. ................. 174/264
5,388,328 A * 2/1995 Yokono et al. .................. 29/852

(Continued)

FOREIGN PATENT DOCUMENTS

JP 06-283661 10/1994
JP 07-037840 2/1995

(Continued)

OTHER PUBLICATIONS

Office Action dated Feb. 12, 2013 for corresponding Japanese Patent Application No. 2009-191283 with English language translation.

(Continued)

*Primary Examiner* — Xiaoliang Chen
(74) *Attorney, Agent, or Firm* — Squire Patton Boggs (US) LLP

(57) ABSTRACT

A multichip module comprising: a base substrate; a wiring board disposed on the base substrate and having a wiring pattern; an adhesive layer configured to bond the base substrate to the wiring board while maintaining an electrical connection between the base substrate and the wiring board; and a plurality of chips connected to a surface of the wiring board, the surface being opposite the adhesive layer, wherein, assuming that $\alpha$ is a coefficient of thermal expansion of the wiring board, $\beta$ is a coefficient of thermal expansion of the base substrate, and $\gamma$ is a coefficient of thermal expansion of the adhesive layer, the relationship $\alpha < \gamma < \beta$ is satisfied.

10 Claims, 9 Drawing Sheets

(56) References Cited

U.S. PATENT DOCUMENTS

| | | | |
|---|---|---|---|
| 5,667,884 A * | 9/1997 | Bolger | 428/323 |
| 5,840,417 A * | 11/1998 | Bolger | 428/323 |
| 5,847,929 A * | 12/1998 | Bernier et al. | 361/719 |
| 5,870,289 A * | 2/1999 | Tokuda et al. | 361/779 |
| 5,918,113 A * | 6/1999 | Higashi et al. | 438/119 |
| 6,087,203 A * | 7/2000 | Eng et al. | 438/118 |
| 6,365,833 B1 * | 4/2002 | Eng et al. | 174/538 |
| 6,387,729 B2 * | 5/2002 | Eng et al. | 438/106 |
| 6,462,282 B1 * | 10/2002 | Inoue et al. | 174/260 |
| 6,528,343 B1 * | 3/2003 | Kikuchi et al. | 438/106 |
| 6,605,491 B1 * | 8/2003 | Hsieh et al. | 438/118 |
| 6,774,493 B2 * | 8/2004 | Capote et al. | 257/778 |
| 2001/0004134 A1 * | 6/2001 | Saitoh | 257/759 |
| 2001/0038151 A1 * | 11/2001 | Takahashi et al. | 257/778 |
| 2002/0001882 A1 * | 1/2002 | Eng et al. | 438/127 |
| 2002/0125568 A1 * | 9/2002 | Jiang et al. | 257/737 |
| 2003/0219969 A1 | 11/2003 | Saito et al. | |
| 2004/0219717 A1 * | 11/2004 | Takahashi et al. | 438/108 |
| 2004/0235221 A1 * | 11/2004 | Taguchi et al. | 438/108 |
| 2005/0017347 A1 * | 1/2005 | Morimoto et al. | 257/703 |
| 2005/0056842 A1 * | 3/2005 | Nishi et al. | 257/66 |
| 2005/0270052 A1 * | 12/2005 | Chase | 324/763 |
| 2006/0151870 A1 * | 7/2006 | Nishiyama et al. | 257/700 |
| 2006/0204733 A1 * | 9/2006 | Murai et al. | 428/209 |
| 2006/0226928 A1 * | 10/2006 | Henning et al. | 333/33 |
| 2007/0015302 A1 * | 1/2007 | Nishi et al. | 438/48 |
| 2007/0256858 A1 * | 11/2007 | Kariya et al. | 174/260 |
| 2008/0111756 A1 * | 5/2008 | Ochi et al. | 343/788 |
| 2008/0237894 A1 * | 10/2008 | Kim et al. | 257/783 |
| 2009/0038830 A1 * | 2/2009 | Tanaka et al. | 174/255 |
| 2009/0040734 A1 * | 2/2009 | Ochi et al. | 361/737 |
| 2009/0084594 A1 * | 4/2009 | Kariya et al. | 174/260 |
| 2009/0121345 A1 | 5/2009 | Sunohara | |
| 2009/0145636 A1 * | 6/2009 | Miki et al. | 174/255 |
| 2009/0212285 A1 * | 8/2009 | Nishi et al. | 257/53 |
| 2009/0243065 A1 * | 10/2009 | Sugino et al. | 257/686 |
| 2009/0309514 A1 * | 12/2009 | Kim | 315/291 |
| 2009/0321119 A1 * | 12/2009 | Kohara et al. | 174/260 |
| 2010/0003771 A1 * | 1/2010 | Nagai et al. | 438/15 |
| 2010/0052163 A1 * | 3/2010 | Ouchi | 257/737 |
| 2010/0259910 A1 * | 10/2010 | Hayashi et al. | 361/783 |
| 2010/0276796 A1 * | 11/2010 | Andry et al. | 257/692 |

FOREIGN PATENT DOCUMENTS

| | | |
|---|---|---|
| JP | 08-064711 | 3/1996 |
| JP | 08-330506 A | 12/1996 |
| JP | 2004-079658 A | 3/2004 |
| JP | 2009-111120 A | 5/2009 |

OTHER PUBLICATIONS

Japanese Office Action dated Dec. 3, 2013 for corresponding JP Patent Appln. No. 2009-191283 with English language translation.

* cited by examiner

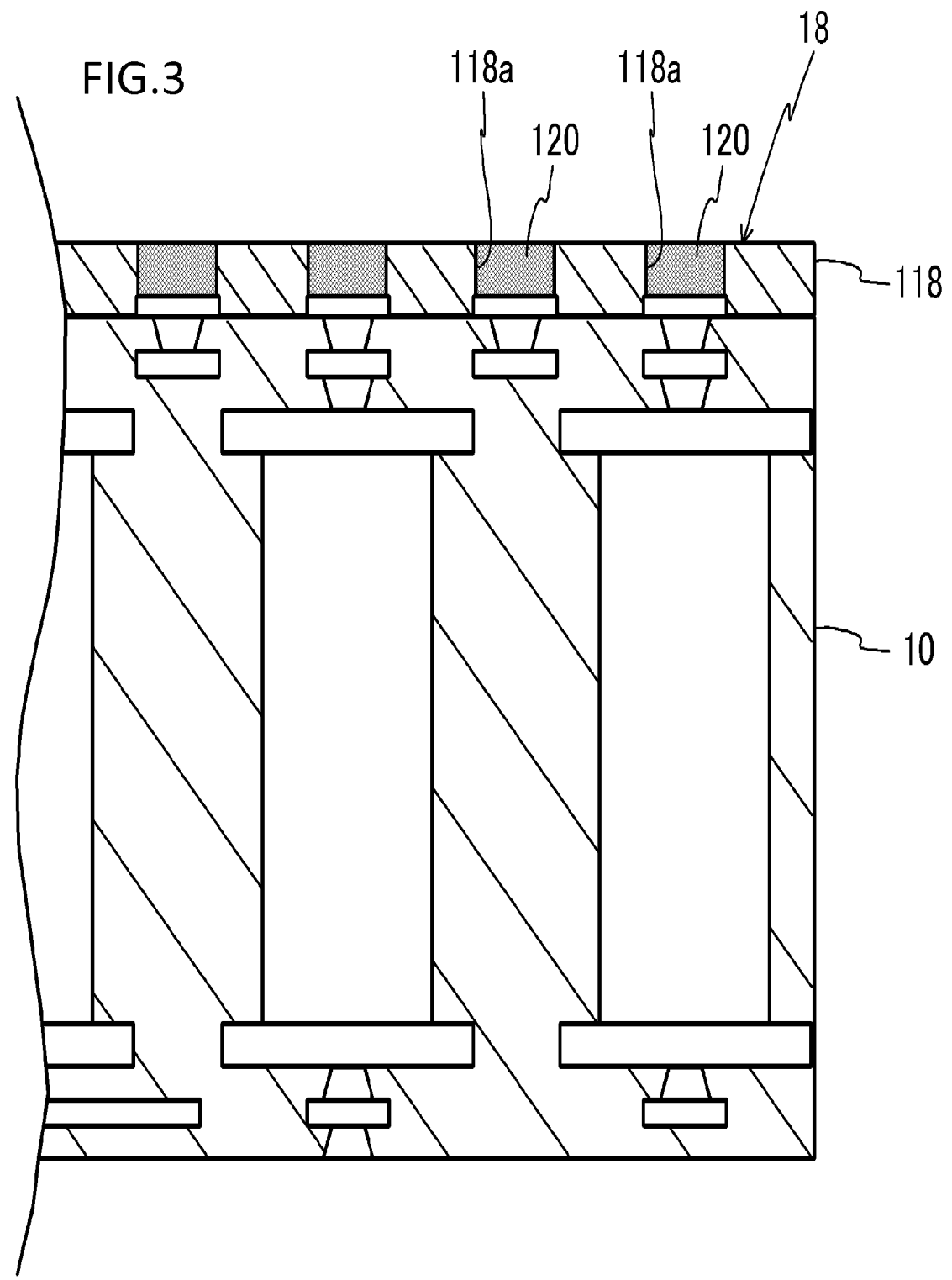

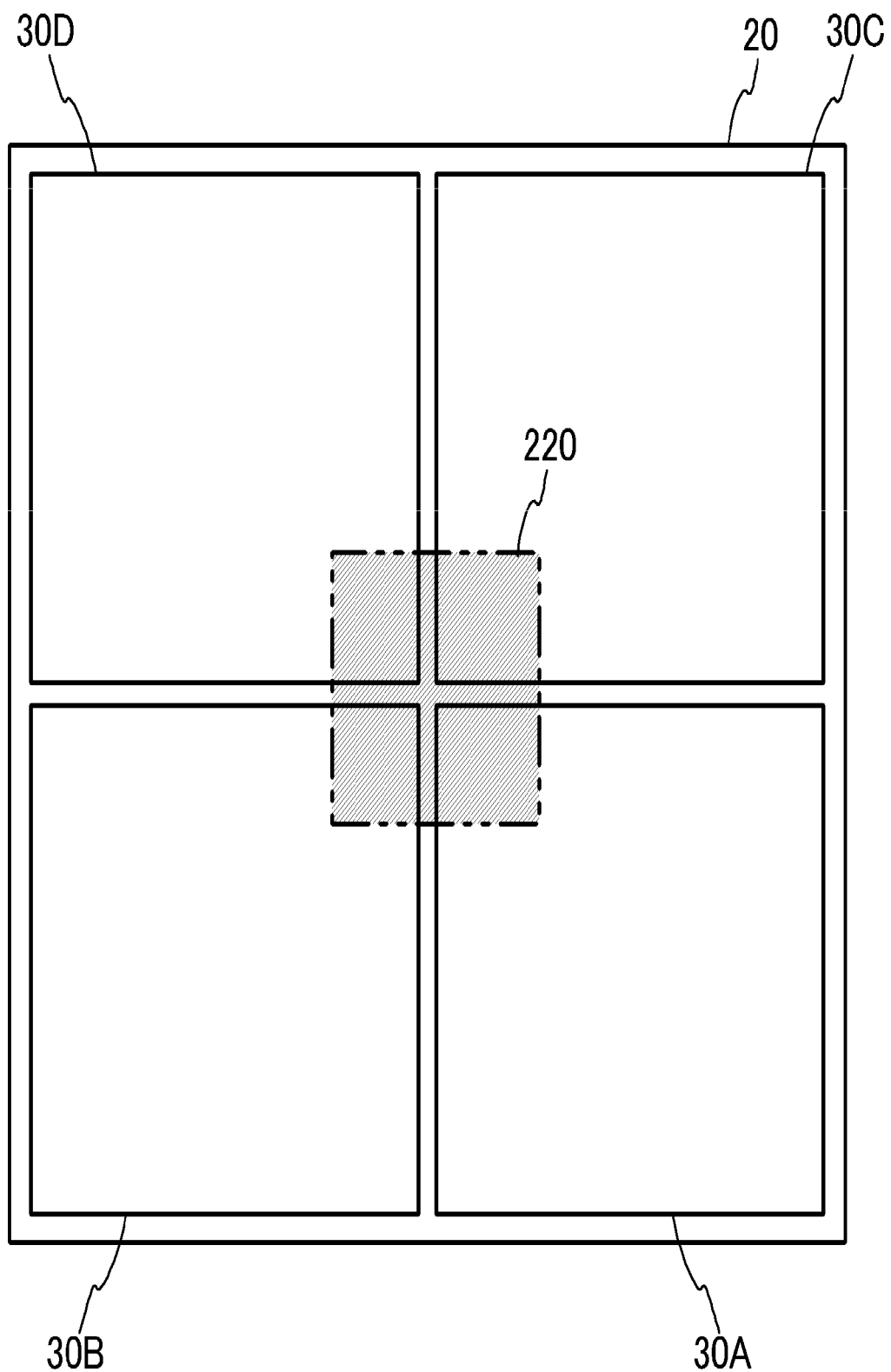

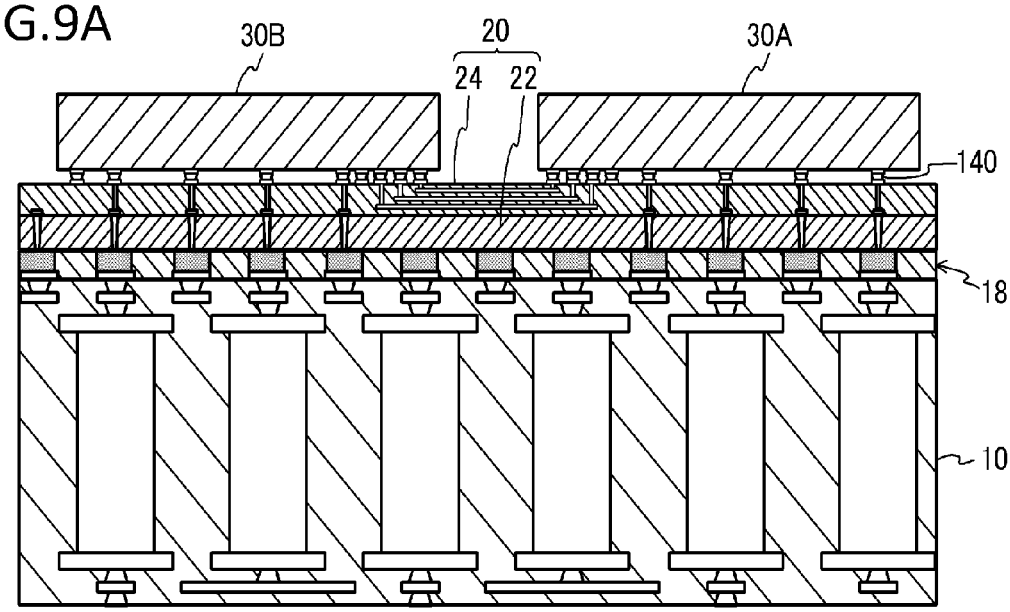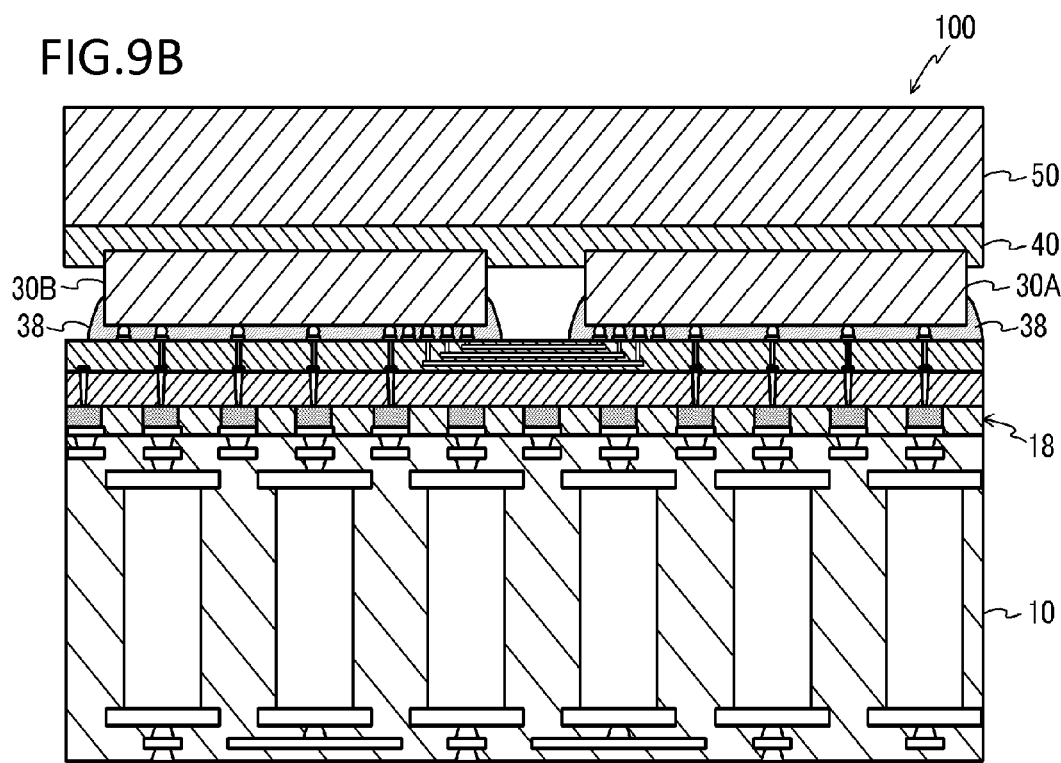

US 8,811,031 B2

MULTICHIP MODULE AND METHOD FOR MANUFACTURING THE SAME

CROSS REFERENCE TO RELATED APPLICATION

This application is based upon and claims the benefit of priority from the prior Japanese Patent Application NO. 2009-191283 filed on Aug. 20, 2009, the entire contents of which are incorporated herein by reference.

FIELD

The embodiments discussed herein are related to a multichip module and a method for manufacturing the multichip module.

BACKGROUND

There have been semiconductor chip modules called multichip modules (MCM) in which a plurality of silicon chips produced in different processes are mounted on a substrate. In such multichip modules, bare chips mounted in a bare state are used as silicon chips and the bare chips are connected to each other using a wire line formed on a ceramic or build-up substrate (Japanese Laid-open Patent Publication No. 06-283661).

In such multichip modules, a large amount of heat is generated during the operation of chips. Therefore, a build-up substrate is thinned by polishing or grinding in advance to increase the heat dissipation effect (Japanese Laid-open Patent Publication No. 07-37840).

However, all of the heat generated during the operation of chips may not be removed from the multichip module even if the method disclosed in Japanese Laid-open Patent Publication No. 07-37840 is employed. Thus, chips, a substrate, and other components disposed on the substrate may be subjected to thermal expansion and deformed owing to the heat. The deformation due to the thermal expansion causes fatigue failure of each component, which may shorten the life of multichip modules.

SUMMARY

According to one aspect of the embodiments, a multichip module described in this specification includes a base substrate; a wiring board disposed on the base substrate and having a wiring pattern; an adhesive layer configured to bond the base substrate to the wiring board while maintaining an electrical connection between the base substrate and the wiring board; and a plurality of chips connected to a surface of the wiring board, the surface being opposite the adhesive layer, wherein, assuming that $\alpha$ is a coefficient of thermal expansion of the wiring board, $\beta$ is a coefficient of thermal expansion of the base substrate, and $\gamma$ is a coefficient of thermal expansion of the adhesive layer, the relationship $\alpha<\gamma<\beta$ is satisfied.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF DRAWINGS

FIG. 3 is an enlarged view of an adhesive sheet;

FIG. 4 is a plan view depicting the arrangement of LSI chips;

FIGS. 9A and 9B are diagrams for describing a method for manufacturing a multichip module (part 4).

DESCRIPTION OF EMBODIMENTS

Figure 1:
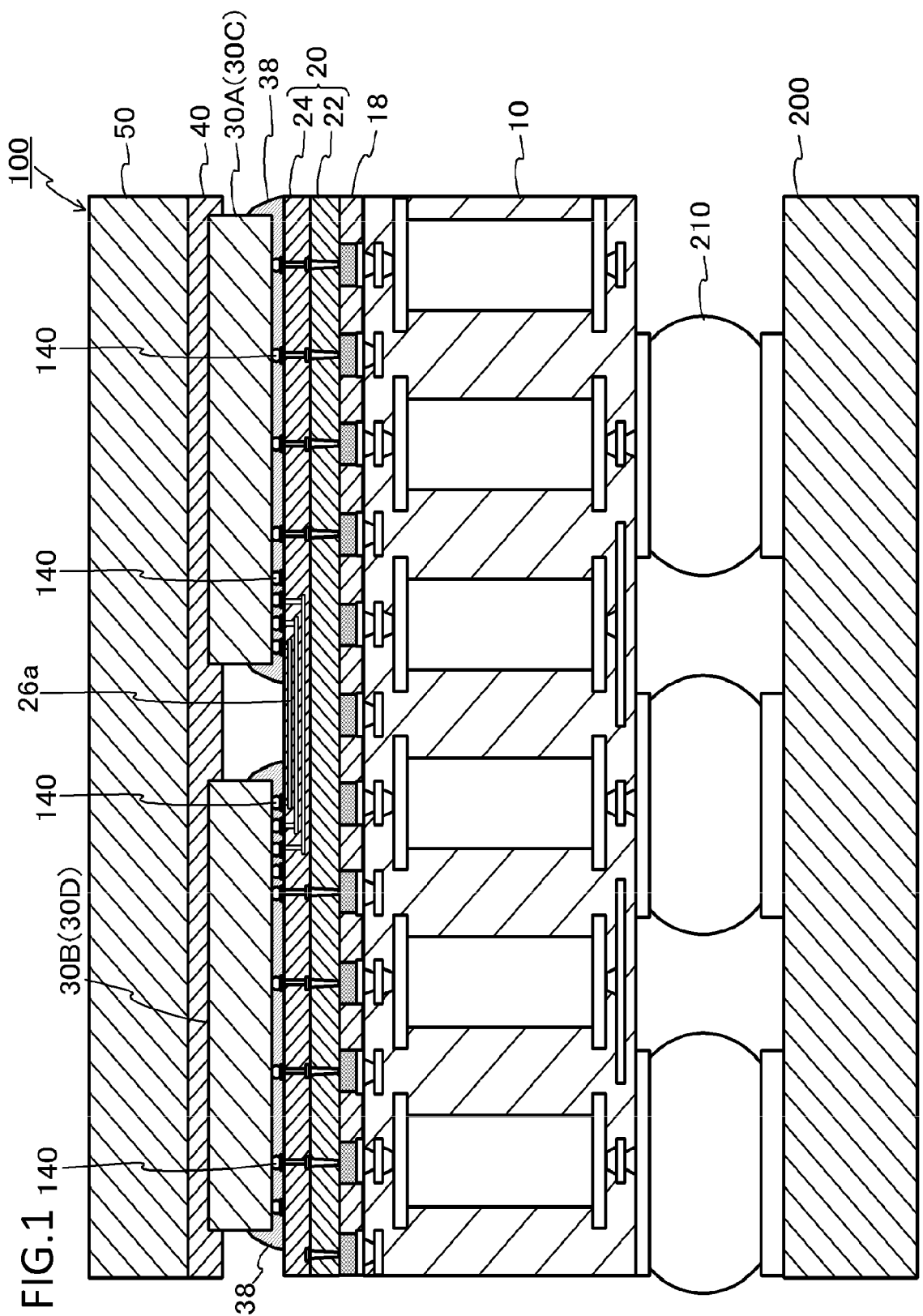
FIG. 1 is a sectional view schematically depicting a multichip module according to an embodiment.

An embodiment of a multichip module and a method for manufacturing the multichip module will now be described in detail with reference to FIGS. 1 to 9B. FIG. 1 is a sectional view schematically depicting a multichip module 100 according to an embodiment. As depicted in FIG. 1, the multichip module 100 is fixed on a motherboard 200 with solder bumps 210 therebetween.

The multichip module 100 includes a base substrate 10, a silicon interposer 20, four LSI chips 30A to 30D (refer to FIG. 4 for LSI chips 30C and 30D), and a heat spreader 50.

The base substrate 10 is also called a build-up substrate. For example, one of the sides of the base substrate 10 is about 30 mm in length and the area thereof is 900 mm² or more. The base substrate 10 is a multi-layer printed circuit board obtained by forming one to three wiring layers on each of the top face and bottom face of a substrate (organic package substrate) called a core substrate on which, for example, four wiring layers are formed. The base substrate 10 is composed of a material such as an epoxy resin or polyimide. The wiring layers are composed of a material such as copper. The coefficient of expansion of the base substrate 10 is $\beta$ (e.g., $\beta$ is 410 to 19 ppm).

Figure 2:
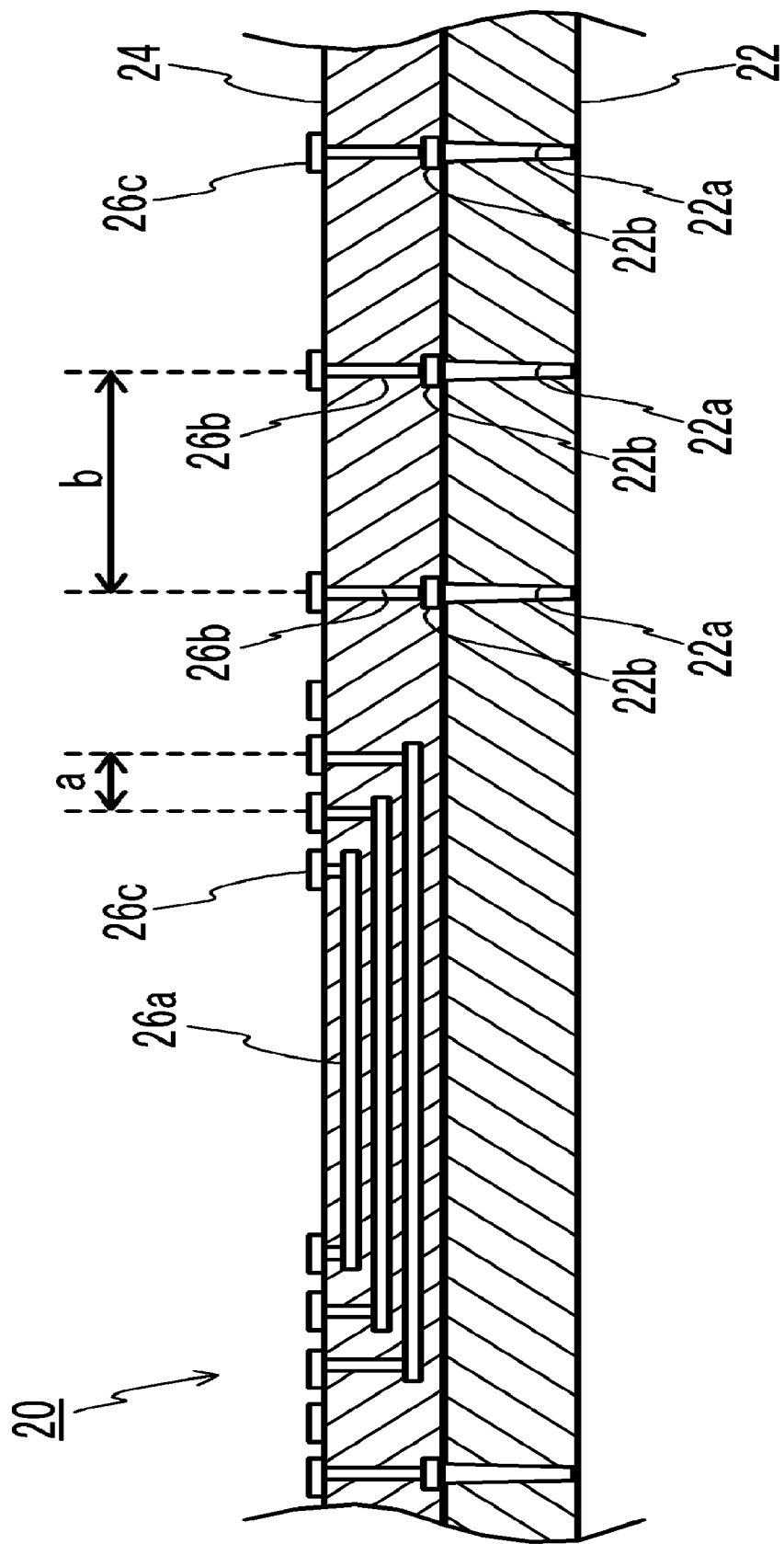
FIG. 2 is a partially enlarged view of a silicon interposer.

The silicon interposer 20 includes a silicon substrate 22 and a wiring layer 24 formed on the upper surface of the silicon substrate 22. For example, one of the sides of the silicon substrate 22 and the wiring layer 24 is about 30 mm in length and the area thereof is 900 mm² or more. The silicon interposer 20 has a thickness of 0.6 mm or less on the whole. FIG. 2 is a partially enlarged view of the silicon interposer 20. As depicted in FIG. 2, a plurality of via holes 22a are formed so as to penetrate through the silicon substrate 22 in the vertical direction. The via holes 22a are filled with a metal such as copper by plating. Furthermore, lands 22b are formed on the silicon substrate 22 so as to cover each of the via holes 22a, and the wiring layer 24 is formed thereon. The wiring layer 24 includes an insulating layer stacked on the silicon substrate 22 and a wiring pattern 26a and via holes 26b formed in and through the insulating layer with a semiconductor manufacturing apparatus such as a semiconductor exposure apparatus. The distance of the wiring pattern 26a is, for example, a fine pitch of 50 μm or less. The distance b between the via holes 26b is a pitch of about 150 to 200 μm. The via holes 26b are filled with a metal such as copper by plating. Furthermore, lands 26c are formed on the upper surface of the wiring layer 24 so as to cover the wiring pattern 26a and each of the via holes 26b.

As depicted in FIG. 1, the silicon interposer 20 is fixed on the upper surface of the base substrate 10 with an adhesive sheet 18 serving as an adhesive layer therebetween. The coefficient of expansion of the silicon interposer 20 is α (α<β and, for example, α is 3 ppm).

For example, one of the sides of the adhesive sheet 18 is about 30 mm in length, the area thereof is 900 mm² or more, and the thickness thereof is 0.1 mm or less. As depicted in FIG. 3 that is an enlarged view, the adhesive sheet 18 includes an adhesive sheet main body 118 and a conductive resin 120 with which holes 118a of the adhesive sheet main body 118 are filled. The holes 118a of the adhesive sheet main body 118 are formed using a laser or the like. The coefficient of expansion of the adhesive sheet 18 is γ (α<γ<β). The adhesive sheet 18 is in surface-contact with the base substrate 10 and the silicon interposer 20.

As depicted in FIG. 4 that is a plan view, the LSI chips 30A to 30D are each obtained by forming a circuit pattern on a silicon wafer and are arranged so as to be adjacent to each other. Herein, the wiring pattern 26a of the silicon interposer 20 is disposed in a hatched region 220 in FIG. 4. The region 220 is a square region having a size of 10 mm×10 mm, for example.

Figure 5A:
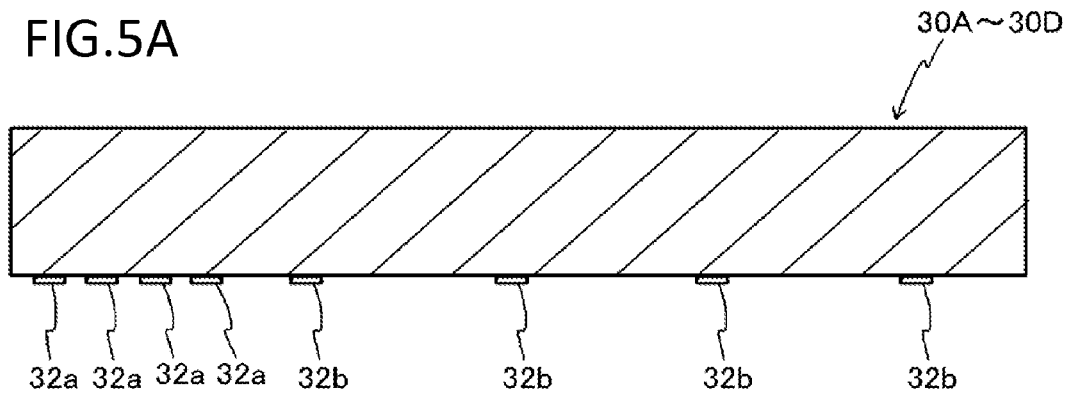
FIG. 5A is an enlarged view of the LSI chips and FIG. 5B depicts the connection state between the LSI chips.
Figure 5B:
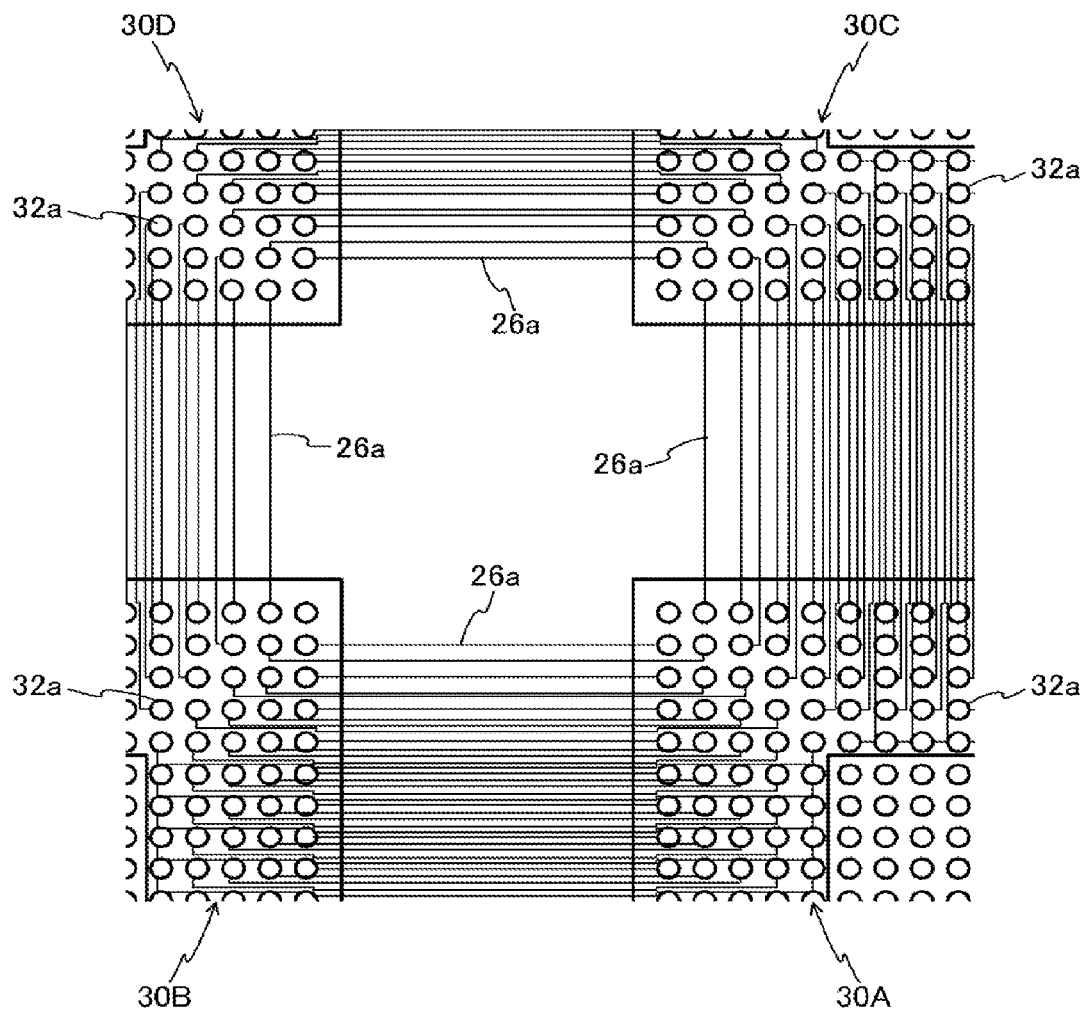

FIG. 5A is an enlarged view of the LSI chips 30A to 30D. As depicted in FIG. 5A, the LSI chips 30A to 30D each include first pads 32a arranged close to one another and second pads 32b arranged so as to be more spaced apart than the first pads 32a on the lower surface thereof. The first pads 32a are connected to the wiring pattern 26a through solder bumps 140 as depicted in FIG. 1. Specifically, in this embodiment, as is clear from FIG. 5B that depicts the connection state between LSI chips, the LSI chip 30A is connected to the LSI chips 30B and 30C through the wiring pattern 26a. Similarly, the LSI chip 30C is connected to the LSI chips 30A and 30D through the wiring pattern 26a. The second pads 32b are connected to the via holes 26b through the solder bumps 140. The gap between the LSI chips 30A to 30D and the silicon interposer 20 is sealed with a resin 38 as depicted in FIG. 1.

The heat spreader 50 is connected to the LSI chips 30A to 30D through a thermal injection material (TIM) 40. The heat spreader 50 is composed of a metal such as copper and has a function of dissipating the heat generated in the LSI chips 30A to 30D.

In the multichip module 100 having the above-described structure, the LSI chips 30A to 30D are connected to each other through the wiring pattern 26a of the silicon interposer 20. The LSI chips 30A to 30D are electrically connected to the base substrate 10 through the via holes 26b and 22a of the silicon interposer 20 and the conductive resin 120 of the adhesive sheet. Thus, the LSI chips 30A to 30D are electrically connected to each other and also electrically connected to the base substrate 10.

Next, a method for manufacturing the multichip module 100 will now be described with reference to FIGS. 6A to 9B.

Figure 6A:
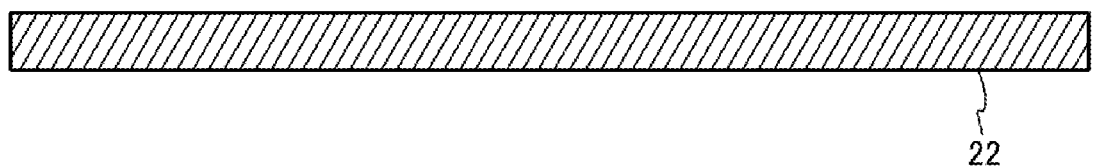
FIGS. 6A to 6E are diagrams for describing a method for manufacturing a multichip module (part 1)
Figure 6B:
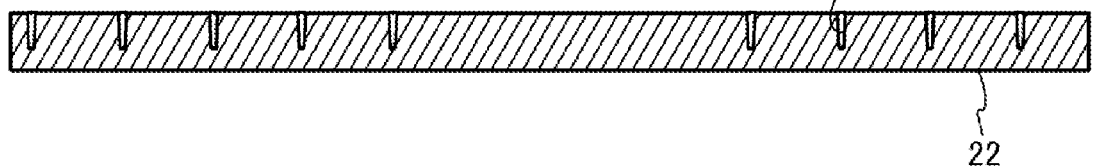

As depicted in FIG. 6A, first, a silicon wafer (substrate 22) having a predetermined thickness is prepared. As depicted in FIG. 6B, holes 122a to be via holes 22a are formed in the substrate 22 by etching. In this case, the holes 122a may be formed so as to penetrate through the substrate 22 or so as not to penetrate through the substrate 22. In FIG. 6B, the holes 122a do not penetrate through the substrate 22.

Figure 6C:
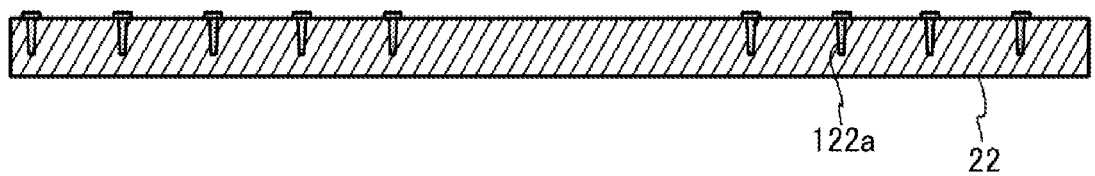
Figure 6D:
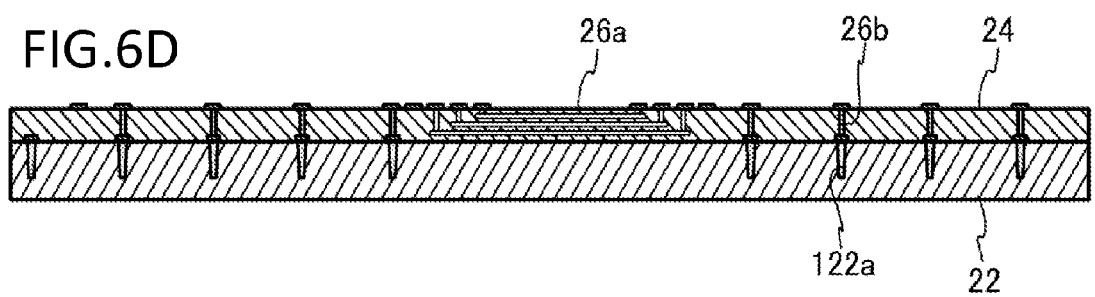

As depicted in FIG. 6C, the holes 122a are filled with a metal such as copper by plating, and, as depicted in FIG. 6D, a wiring layer 24 is formed on the substrate 22. In this case, the wiring layer 24 is formed by stacking an insulating layer on the substrate 22 and then by forming a wiring pattern 26a and via holes 26b in the insulating layer using a semiconductor manufacturing apparatus such as a semiconductor exposure apparatus. Therefore, the wiring pattern 26a has a very fine pitch.

Figure 6E:
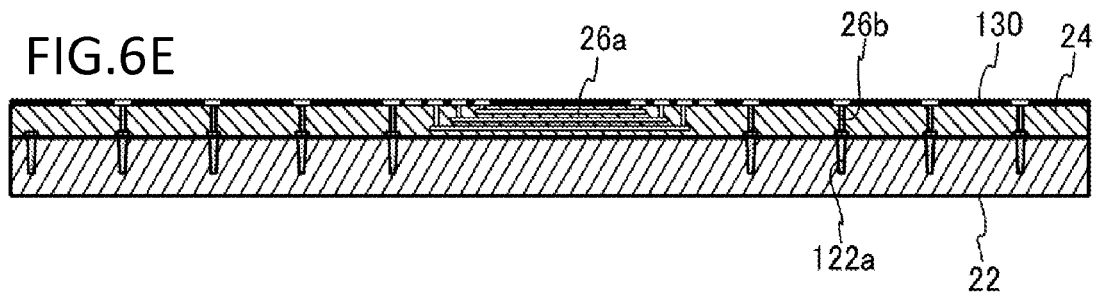
Figure 7A:
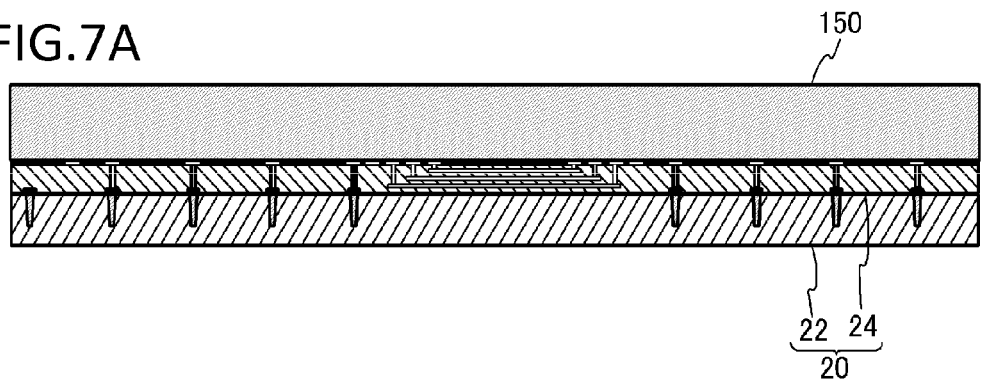
FIGS. 7A to 7C are diagrams for describing a method for manufacturing a multichip module (part 2)

As depicted in FIG. 6E, an adhesive (e.g., wax) 130 with a low adhesive strength is applied on the upper surface of the wiring layer 24 in a portion where the pattern is not formed. As depicted in FIG. 7A, a carrier 150 with a plate-like shape is fixed on the upper surface of the wiring layer 24 with the adhesive 130 that has been applied in FIG. 6E. A member with a plate-like shape composed of glass or ceramic is used as the carrier 150.

Figure 7B:
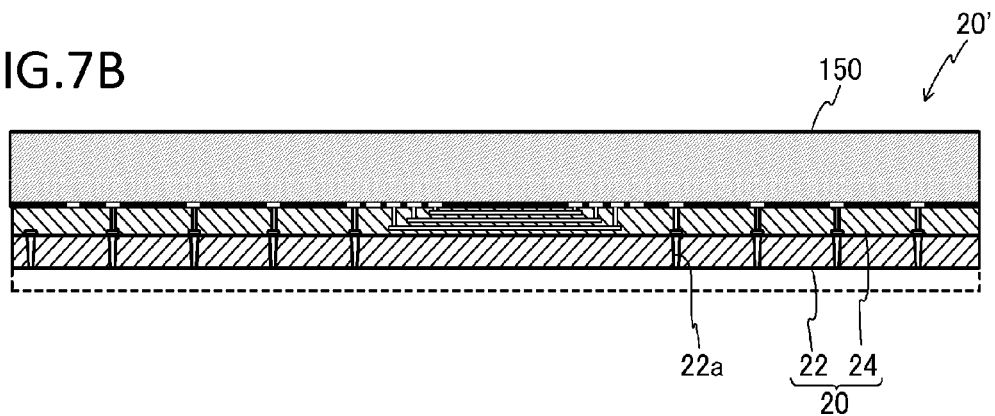

As depicted in FIG. 7B, the thickness of the substrate 22 is adjusted to a desired value by grinding the lower surface of the substrate 22. In this step, the holes 122a that do not yet penetrate entirely through the substrate 22 eventually penetrate entirely through the substrate 22 and become via holes 22a. The structural body depicted in FIG. 7B is hereinafter referred to as a silicon interposer unit 20'.

Figure 7C:
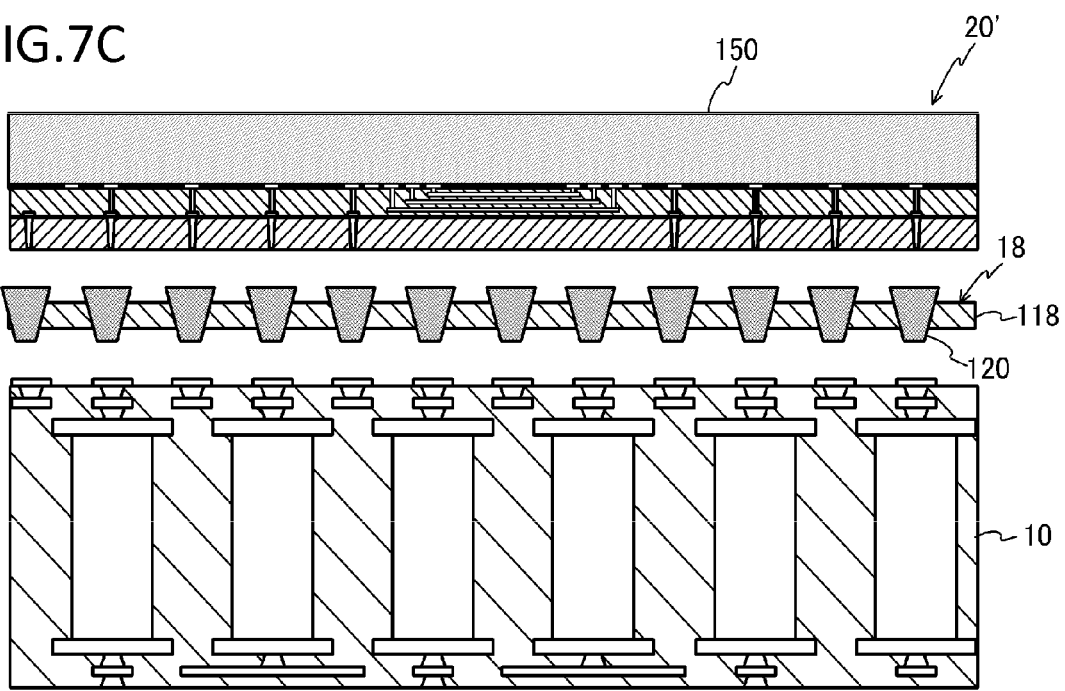
Figure 8A:
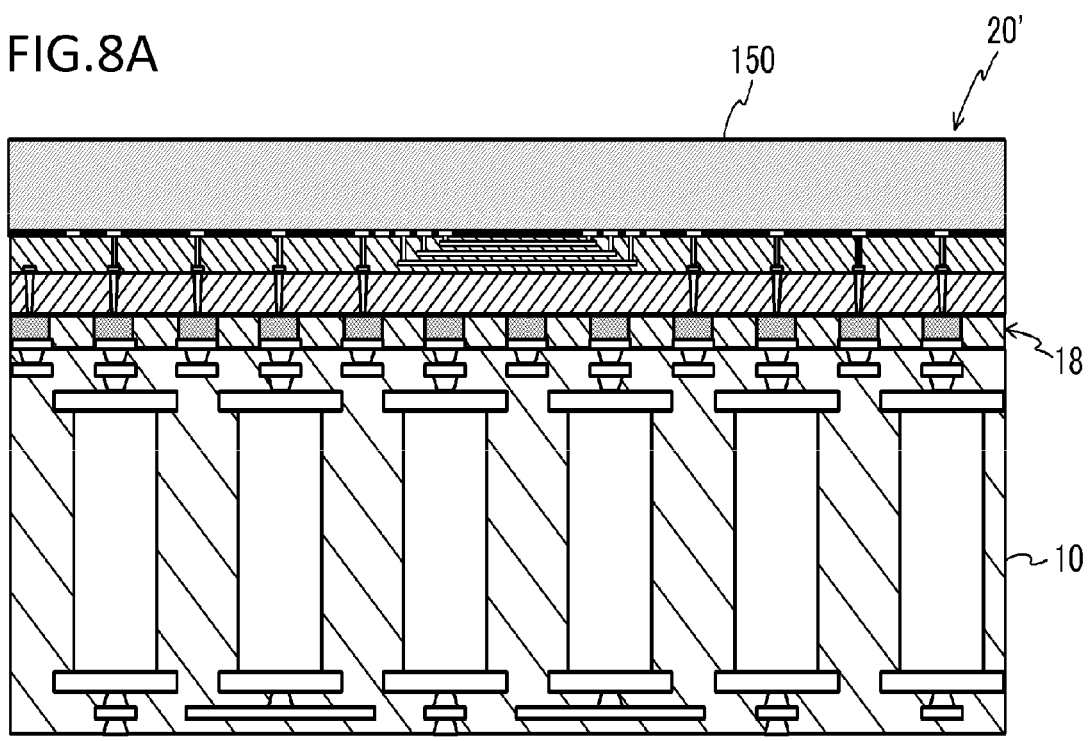
FIGS. 8A and 8B are diagrams for describing a method for manufacturing a multichip module (part 3)

As depicted in FIG. 7C, the silicon interposer unit 20' is placed on the base substrate 10 with an adhesive sheet 18 therebetween. Herein, in the adhesive sheet 18, a conductive resin 120 protrudes from an adhesive sheet main body 118. As depicted in FIG. 8A, by applying heat and pressure in the vertical direction, the silicon interposer unit 20' is bonded to the base substrate 10 with the adhesive sheet 18. The heating is performed at about 170° C. In the state in which the bonding has been completed, the substrate 22 is electrically connected to the base substrate 10 through the conductive resin 120.

Figure 8B:
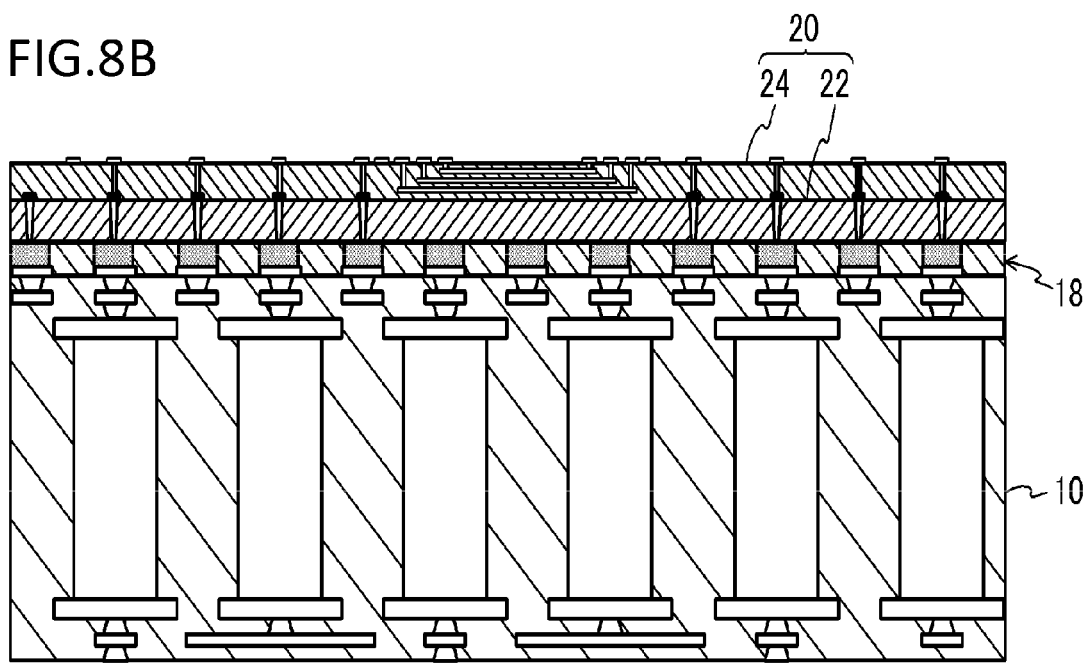

As depicted in FIG. 8B, the carrier 150 is then removed. Since the carrier 150 is bonded to the silicon interposer 20 with the adhesive 130 such as wax having a low adhesive strength, the carrier 150 may be easily removed.

As depicted in FIG. 9A, LSI chips 30A to 30D are fixed on the silicon interposer 20 with solder bumps 140 therebetween. As depicted in FIG. 9B, a heat spreader 50 is disposed on the LSI chips 30A to 30D with a TIM 40 therebetween, whereby the manufacturing of the multichip module 100 is completed.

As specifically described above, according to this embodiment, the multichip module 100 includes the silicon interposer 20 that is disposed on the base substrate 10 and has the wiring pattern 26a and the adhesive sheet 18 that bonds the base substrate 10 to the silicon interposer 20 while maintaining the electrical connection between the base substrate 10 and the silicon interposer 20. In addition, the relationship α<γ<β is satisfied, where α is a coefficient of expansion of the silicon interposer 20, β is a coefficient of expansion of the base substrate 10, and γ is a coefficient of expansion of the adhesive sheet 18. Thus, the difference in coefficient of expansion between the silicon interposer 20 and the base substrate 10 is reduced by the adhesive sheet 18. Specifically, if the silicon interposer 20 is in direct contact with the base substrate 10, the contact surface is deformed because of the difference in coefficient of expansion, which may cause fatigue failure. However, by disposing the adhesive sheet 18 between the silicon interposer 20 and the base substrate 10, the deformation of the contact surface is suppressed and thus the occurrence of fatigue failure may be suppressed. Accordingly, by reducing the effect of heat, the life of the multichip module 100 may be lengthened.

In this embodiment, the adhesive sheet 18 is in surface-contact with the base substrate 10 and the silicon interposer 20. Thus, the deformation of the silicon interposer 20 may be suppressed compared with the case where the adhesive sheet 18 is in contact with the silicon interposer 20 at multiple points. As a result, the damage to the silicon interposer 20 and the performance deterioration of the silicon interposer 20 may be suppressed.

In this embodiment, since the silicon interposer 20 is bonded to the base substrate 10 with the adhesive sheet 18, the temperature requested during the boding may be decreased compared with the case where bonding is performed with solder. Specifically, the temperature requested during bonding with solder is about 210° C. whereas the temperature requested during the bonding with the adhesive sheet 18 is about 170° C. Thus, the effect of heat on the silicon interposer 20 and the base substrate 10 during the bonding may be reduced, and therefore the deformation of the silicon interposer 20 and the base substrate 10 may be suppressed.

In this embodiment, the conductive resin 120 is embedded in at least part of the adhesive sheet 18 to maintain the electrical connection between the base substrate 10 and the silicon interposer 20. Thus, by simply sandwiching the adhesive sheet 18 between the base substrate 10 and the silicon interposer 20, the electrical connection between the base substrate 10 and the silicon interposer 20 may be established.

In this embodiment, when the multichip module is manufactured, the silicon interposer 20 is fixed to the carrier 150, which is a member with a plate-like shape, and the silicon interposer 20 fixed to the carrier 150 (silicon interposer unit 20') and the base substrate 10 are bonded to each other with the adhesive sheet 18 therebetween. After the bonding, the carrier 150 is removed from the silicon interposer 20 and a plurality of LSI chips 30A to 30D are connected to the silicon interposer 20. As described above, since the structural body (20') obtained by fixing the silicon interposer 20 to the carrier 150 is fixed on the base substrate 10 with the adhesive sheet 18 therebetween, the silicon interposer 20 that is difficult to handle and is easily damaged may be easily fixed to the base substrate 10.

In this embodiment, the plurality of LSI chips 30A to 30D are electrically connected to each other through the silicon interposer 20 manufactured separately from the base substrate. In this case, the wiring pattern of the silicon interposer 20 may be made to be finer, and thereby the wiring pattern may be shortened and the distance between the LSI chips may be decreased. Thus, the four LSI chips may be treated as a single large virtual chip. Herein, since there is no need to prepare an exposure apparatus and a large mask for manufacturing large LSI chips, a multichip module having a desired performance may be manufactured at low cost.

In this embodiment, since there is no need to ensure a channel area in accordance with wiring specifications, the distance between the chips may be decreased. Furthermore, by decreasing the distance between the chips, the length of wiring lines may be decreased, whereby high-speed transmission between the LSI chips may be achieved. Moreover, by decreasing the length of wiring lines, a driver of an LSI chip having the same specifications as the driver inside the LSI chip may be used, and thereby the LSI chip itself may be reduced in size.

In the above-described embodiment, the case where the base substrate is an organic package substrate has been described. However, the configuration is not limited thereto and a substrate composed of a different material may be used. Herein, even in such a case, the coefficient of expansion of the adhesive sheet needs to be an intermediate value between those of the base substrate and the silicon interposer.

In the above-described embodiment, the case where four LSI chips are disposed has been described. However, the configuration is not limited thereto and any (multiple) number of LSI chips may be disposed.

In the above-described embodiment, the LSI chips are used as chips. However, the configuration is not limited thereto and other chips may be used. Furthermore, in the above-described embodiment, the silicon interposer is used as a wiring board. However, the configuration is not limited thereto and a substrate composed of a material other than silicon may be used.

The above-described embodiment is an example of preferred embodiments of the present invention, but is not limited to the example. Various modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

The invention claimed is:

1. A multichip module comprising:
    a base substrate including a core substrate having wiring layers on each of a top surface and a bottom surface;
    a wiring board disposed on the base substrate and having a wiring pattern;
    an adhesive sheet comprising an adhesive sheet main body with a plurality of holes and conductive resin, each of the plurality of holes being filled with the conductive resin so that the conductive resin within the each of the plurality of holes performs as a via, wherein the adhesive sheet is configured to bond the base substrate to the wiring board while maintaining an electrical connection between the base substrate and the wiring board; and
    a plurality of chips connected to a surface of the wiring board, the surface being opposite the adhesive sheet,
    wherein, assuming that $\alpha$ is a coefficient of thermal expansion of the wiring board, $\beta$ is a coefficient of thermal expansion of the base substrate, and $\gamma$ is a coefficient of thermal expansion of the adhesive sheet main body, the relationship $\alpha \leq \gamma \leq \beta$ is satisfied.

2. The multichip module according to claim 1, wherein the adhesive sheet is in surface-contact with the base substrate and the wiring board.

3. The multichip module according to claim 1, wherein the conductive resin is embedded in at least part of the adhesive sheet to maintain the electrical connection between the base substrate and the wiring board.

4. The multichip module according to claim 2, wherein the conductive resin is embedded in at least part of the adhesive sheet to maintain the electrical connection between the base substrate and the wiring board.

5. The multichip module according to claim 1, wherein the wiring board includes a silicon substrate and an insulating layer in which the wiring pattern is formed.

6. The multichip module according to claim 4, wherein the base substrate is an organic package substrate.

7. The multichip module according to claim 1, wherein the plurality of vias comprise laser-formed vias.

8. The multichip module according to claim 1, wherein the wiring board comprises a central connection region for interconnecting all of the plurality of chips.

9. The multichip module according to claim 1, wherein the wiring board comprises a peripheral connection region for connecting the plurality of chips to the base substrate.

10. A multichip module comprising:
a base substrate including a core substrate having wiring layers on each of a top surface and a bottom surface;
a wiring board disposed on the base substrate, the wiring board including a silicon substrate and an insulating layer having a wiring pattern;
an adhesive sheet comprising an adhesive sheet main body with a plurality of holes and conductive resin, each of the plurality of holes being filled with the conductive resin so that the conductive resin within the each of the plurality of holes performs as a via and configured to bond the base substrate to the wiring board while maintaining an electrical connection between the base substrate and the wiring board; and
a plurality of chips connected to a surface of the wiring board, the surface being opposite the adhesive sheet,
wherein, assuming that $\alpha$ is a coefficient of thermal expansion of the wiring board, $\beta$ is a coefficient of thermal expansion of the base substrate, and $\gamma$ is a coefficient of thermal expansion of the adhesive sheet main body, the relationship $\alpha \leq \gamma \leq \beta$ is satisfied.

\* \* \* \* \*